US008742264B2

(12) United States Patent
Happoya et al.

(10) Patent No.: US 8,742,264 B2
(45) Date of Patent: Jun. 3, 2014

(54) ELECTRONIC APPARATUS

(75) Inventors: Akihiko Happoya, Ome (JP); Yasuki Torigoshi, Tachikawa (JP); Sadahiro Tamai, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 13/407,612

(22) Filed: Feb. 28, 2012

(65) Prior Publication Data

US 2013/0003322 A1    Jan. 3, 2013

(30) Foreign Application Priority Data

Jun. 29, 2011    (JP) ................................. 2011-144868

(51) Int. Cl.
*H05K 1/11*    (2006.01)
(52) U.S. Cl.
USPC ......................................................... 174/264
(58) Field of Classification Search
USPC ................................................. 174/264–265
See application file for complete search history.

(56) References Cited

U.S. PATENT DOCUMENTS

| 5,480,839 | A | 1/1996 | Ezawa et al. | |
| 7,356,916 | B2 | 4/2008 | Nishii et al. | |
| 2003/0098179 | A1* | 5/2003 | Obata et al. | 174/262 |
| 2005/0023035 | A1* | 2/2005 | Fuller et al. | 174/264 |
| 2006/0292769 | A1 | 12/2006 | Wata et al. | |
| 2010/0307807 | A1* | 12/2010 | Noda et al. | 174/264 |

FOREIGN PATENT DOCUMENTS

| JP | H06-216258 A | 8/1994 |
| JP | H11-163499 A | 6/1999 |
| JP | 2001-160668 A | 6/2001 |
| JP | 2001-244607 | 9/2001 |
| JP | 2003-168862 A | 6/2003 |
| JP | 2004-241514 A | 8/2004 |
| JP | 2007-005519 A | 1/2007 |
| JP | 2007-194341 A | 8/2007 |
| JP | 2008-166413 A | 7/2008 |
| JP | 2008-258357 A | 10/2008 |
| JP | 2008-2258358 A | 10/2008 |
| JP | 2009-217084 A | 9/2009 |
| JP | 2010-139771 A | 6/2010 |
| TW | 538664 | 6/2003 |

OTHER PUBLICATIONS

Notice of Reasons for Rejection mailed Mar. 6, 2012, in corresponding Japanese Patent Application No. 2011-144868 in 8 pages.
First Office Action mailed May 14, 2013, in corresponding Japanese Pat. App. No. 2012-112410 in six (6) pages.
Office Action mailed Jun. 21, 2013, in corresponding Taiwanese Pat. App. No. 100145043 in fourteen (14) pages.

* cited by examiner

*Primary Examiner* — Jeremy C Norris
(74) *Attorney, Agent, or Firm* — Knobbe, Martens, Olson & Bear, LLP

(57) ABSTRACT

According to one embodiment, an electronic apparatus includes a housing and a flexible printed wiring board in the housing. The flexible printed wiring board includes a via, an insulator, a first conductive pattern, and a second conductive pattern. The insulator around the via includes a first surface and a second surface opposite to the first surface. The first conductive pattern is connected to the via on the first surface. The second conductive pattern is connected to the via on the second surface.

16 Claims, 10 Drawing Sheets

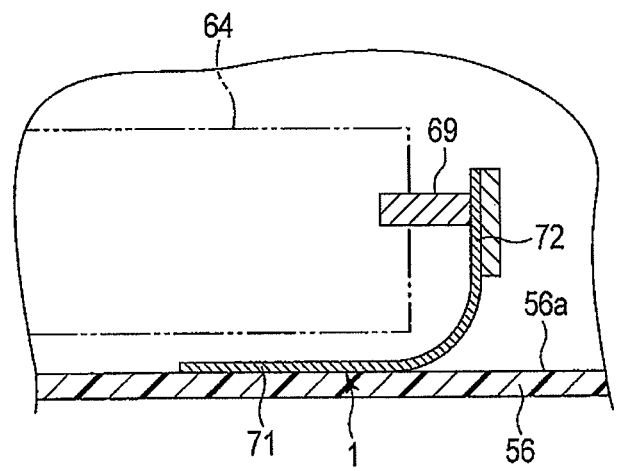
F I G. 11
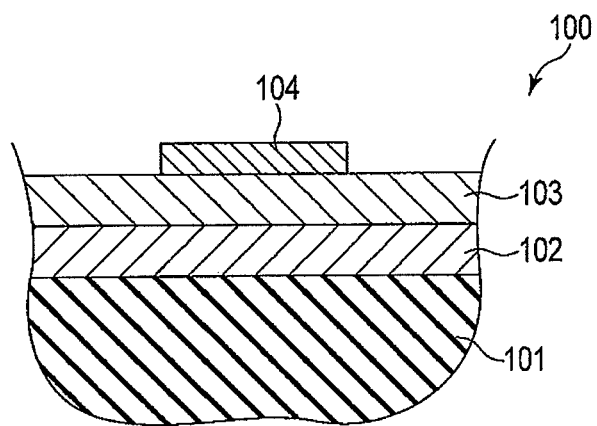
F I G. 12

ELECTRONIC APPARATUS

CROSS-REFERENCE TO RELATED APPLICATIONS

This application is based upon and claims the benefit of priority from prior Japanese Patent Application No. 2011-144868, filed Jun. 29, 2011, the entire contents of which are incorporated herein by reference.

FIELD

Embodiments described herein relate generally to electronic apparatuses.

BACKGROUND

A printed wiring board with through-holes is provided by laminating a copper film on a substrate, opening holes with drill, and plating inner surfaces of the holes.

In the case where plating is performed to form the through-hole, a portion of a plating layer is further laminated on a copper film which is laminated on a substrate. Therefore, the thickness of the printed wiring board is likely to increase. Accordingly, an electronic apparatus including the printed wiring board is likely to be thick.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 11 is an exemplary cross-sectional view illustrating a flexible printed wiring board shown in FIG. 10;

FIG. 12 is an exemplary cross-sectional view schematically illustrating a printed wiring board related to the first embodiment before etching.

DETAILED DESCRIPTION

Various embodiments will be described hereinafter with reference to the accompanying drawings.

In general, according to one embodiment, an electronic apparatus comprises a housing and a flexible printed wiring board in the housing. The flexible printed wiring board comprises a via, an insulator, a first conductive pattern, and a second conductive pattern. The insulator around the via comprises a first surface and a second surface opposite to the first surface. The first conductive pattern is connected to the via on the first surface. The second conductive pattern is connected to the via on the second surface.

Hereinafter, exemplary embodiments will be described with reference to the drawings.

(First Embodiment)

Figure 1:
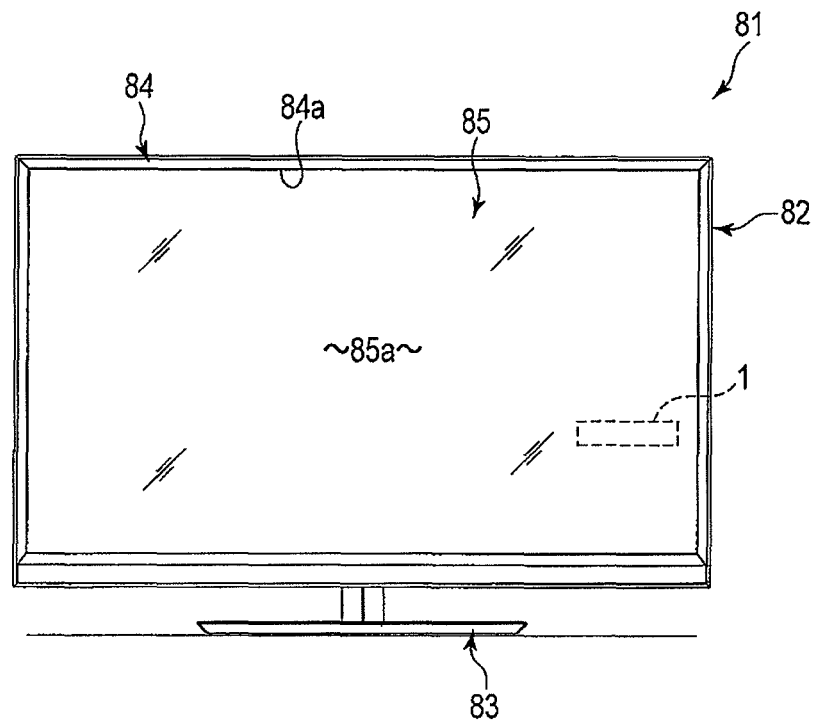
FIG. 1 is an exemplary front view of a television according to a first embodiment.

FIG. 1 illustrates a television 81 according to a first embodiment. The television 81 is an example of an "electronic apparatus". The television 81 includes a main portion 82 and a stand 83 that supports the main portion 82. The main portion 82 includes a housing 84 and a display device 85 provided in the housing 84. The display device 85 includes a display screen 85*a* on which an image is displayed. The housing 84 includes an opening portion 84*a* through which the display screen 85*a* is exposed.

As shown in FIG. 1, the housing 84 accommodates a flexible printed wiring board 1. The housing 84 may accommodate a flexible printed wiring board 1 according to the following second or third embodiment, instead of the flexible printed wiring board 1 according to the first embodiment.

Hereinafter, the flexible printed wiring board 1 will be described in detail.

FIGS. 2, 3, 4, 5, and 6 illustrate the flexible printed wiring board 1 according to the first embodiment. The flexible printed wiring board 1 has flexibility (i.e., bendability) and can be greatly deformed (i.e., bent). The term "flexible printed wiring board" herein is not limited to a flexible printed wiring board that can be bent at a large angle of, for example, more than 90 degrees, and includes a flexible printed wiring board that can be bent at a small angle (for example, an angle of 5 degrees or more).

Figure 2:
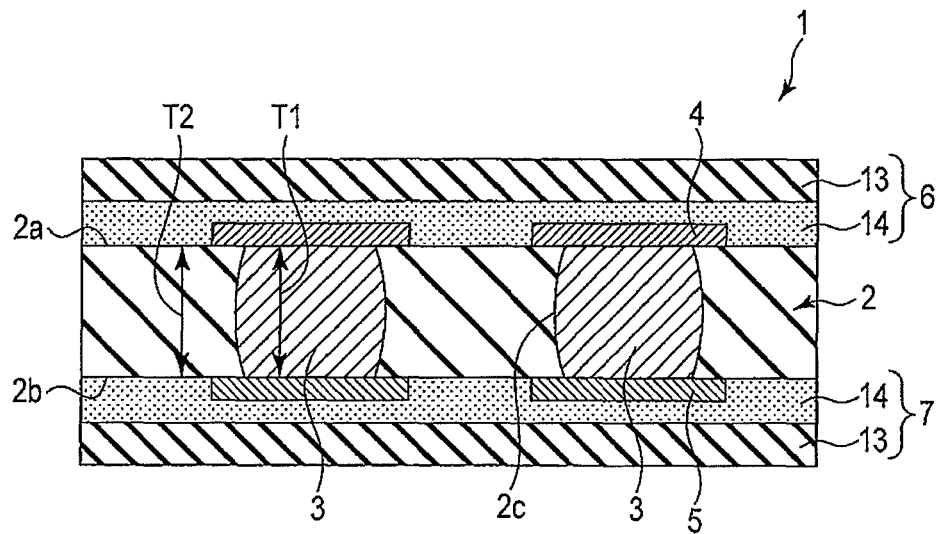
FIG. 2 is an exemplary cross-sectional view schematically illustrating a printed wiring board according to the first embodiment.

FIG. 2 schematically illustrates an example of the structure of the flexible printed wiring board 1. The flexible printed wiring board 1 includes an insulator 2 (i.e., insulating portion), vias 3, a first conductive pattern 4, a second conductive pattern 5, a first cover layer 6, and a second cover layer 7.

The insulator 2 is called, for example, a substrate, a base, or a base film and is a film insulator (i.e., insulating layer). The insulator 2 is made of an insulating material 11 (see FIGS. 3 and 4) that is flexible (i.e., bendable) after being cured. The insulator 2 is applied around the vias 3. The insulator 2 is provided by curing the insulating material 11 (i.e., insulating resin), such as a thermosetting resin or a thermoplastic resin.

The insulating material 11 according to the embodiment has, for example, the characteristics (e.g., viscosity or hardness) in which it can be applied by a screen printing method or an ink-jet method. The insulating material 11 is, for example, soluble and is to be in a liquid state (i.e., ink state).

Specific examples of the insulating material 11 according to the embodiment include an epoxy resin, a polyimide resin, a polyamide resin, a polyethylene terephthalate resin, a liquid crystal polymer resin, a silicon resin, a urethane resin, a fluorine resin, and alone or in mixtures thereof. The insulating material 11 is not limited to the examples.

As shown in FIG. 2, the insulator 2 includes a first surface 2a and a second surface 2b opposite to the first surface 2a. Holes 2c are provided between the first surface 2a and the second surface 2b of the insulator 2. That is, the holes 2c pass from the first surface 2a to the second surface 2b.

The via 3 is provided in the hole 2c of the insulator 2. The via 3 is extended from the first surface 2a to the second surface 2b of the insulator 2. The thickness T1 of the via 3 is substantially equal to the thickness T2 of the insulator 2. The via 3 is made of the conductive paste 12. The via 3 is provided by curing, for example, conductive paste 12 (see FIGS. 3 and 4).

The conductive paste 12 is, for example, conductive paste or solder paste (i.e., solder-based paste). An example of the "conductive paste" is a mixture of conductive powder and a thermosetting resin (or a thermoplastic resin). For example, the conductive paste is copper-based paste, silver-based paste, or a mixture thereof. In addition, the "conductive paste" may be nanopaste, such as copper-based nanopaste or silver-based nanopaste. An example of the "solder paste" is a mixture of fine particles of a solder alloy and flux.

The conductive paste 12 according to the embodiment has the characteristics (e.g., viscosity or hardness) in which it can be applied by, for example, a screen printing method or an ink-jet method. The conductive paste 12 is not limited to the examples.

As shown in FIG. 2, the first conductive pattern 4 (i.e., first conductive layer) is provided on the first surface 2a of the insulator 2. The first conductive pattern 4 is connected (e.g., bonded) to the via 3 and is electrically connected to the via 3. The second conductive pattern 5 (i.e., second conductive layer) is provided on the second surface 2b of the insulator 2. The second conductive pattern 5 is connected (e.g., bonded) to the via 3 and is electrically connected to the via 3. That is, the via 3 is electrically connected to the first conductive pattern 4 and the second conductive pattern 5.

Each of the first conductive pattern 4 and the second conductive pattern 5 is, for example, a wiring pattern (e.g., signal layer). One of the first conductive pattern 4 and the second conductive pattern 5 may be a wide layer, such as a power supply layer or a ground layer.

The flexible printed wiring board 1 is a so-called two-layer member in which, for example, the first conductive pattern 4 and the second conductive pattern 5 are directly laminated on the insulator 2.

As shown in FIG. 2, the first cover layer 6 (i.e., first cover lay) is overlaid (i.e., laminated) on the first conductive pattern 4. The second cover layer 7 (i.e., second cover lay) is overlaid (i.e., laminated) on the second conductive pattern 5. Each of the first cover layer 6 and the second cover layer 7 is a protective insulator (i.e., insulating layer) and is exposed to the outside of the flexible printed wiring board 1.

As shown in FIG. 2, each of the first cover layer 6 and the second cover layer 7 includes, for example, a surface layer 13 and an adhesive layer 14 (i.e., adhesive) provided between the surface layer 13 and the insulator 2. The surface layer 13 is made of an insulating resin, such as a polyimide resin or a polyethylene terephthalate resin.

Figure 3:
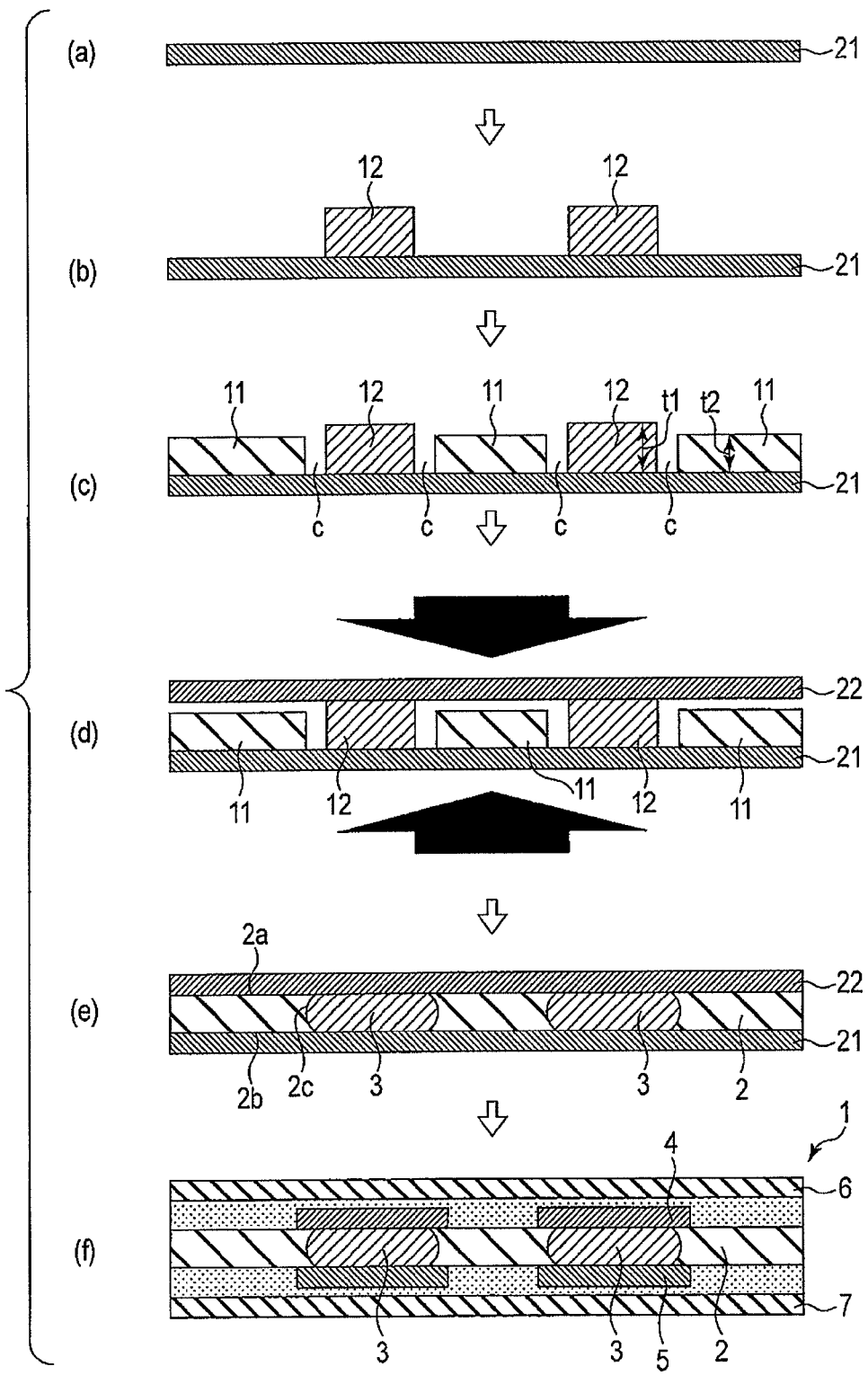
FIG. 3 is an exemplary diagram schematically illustrating a first method of manufacturing the printed wiring board shown in FIG. 2.

Next, a first manufacturing method, which is an example of a method of manufacturing the flexible printed wiring board 1, will be described with reference to FIG. 3.

First, as shown in FIG. 3(a), a first conductive film 21 is prepared (Step 1). The first conductive film 21 is plate-shaped (i.e., planar) metal film, which is a material from which the first conductive pattern 4 will be provided in the subsequent process. That is, the first conductive film 21 is a flat film in which a wiring pattern is not provided. The first conductive film 21 is, for example, a copper film, but is not limited thereto.

Then, as shown in FIG. 3(b), the conductive paste 12 forming the via 3 is applied to the first conductive film 21 (Step 2). The conductive paste 12 is applied in a fluid state to the first conductive film 21 by, for example, a screen printing method or an ink-jet method. The "ink-jet" method generates fine droplets of the conductive paste 12 and directly applies the droplets to the first conductive film 21.

For example, the conductive paste 12 according to the embodiment is adjusted so as to have a relatively large thixotropic ratio. That is, in a state where the paste 12 is applied at a high speed by the screen printing method or the ink-jet method, the paste 12 has low viscosity. In a state where the paste 12 is applied to the first conductive film 21 and the application of the paste is stopped, the paste 12 has high viscosity. Therefore, the conductive paste 12 applied to the first conductive film 21 is less likely to lose its shape (i.e., to be sheared) and is formed in a columnar shape (e.g., a pillar shape, a cylindrical shape, or a prism shape) on the first conductive film 21. For example, the applied conductive paste 12 is heated and semi-cured (i.e., preliminarily cured).

Then, as shown in FIG. 3(c), the insulating material 11 forming the insulator 2 is applied to the first conductive film 21 (Step 3). For example, after the conductive paste 12 is applied, the insulating material 11 is applied to the first conductive film 21. As described in a manufacturing method according to the following second embodiment, the insulating material 11 may be applied to the first conductive film 21 before the conductive paste 12 is applied. In addition, the insulating material 11 may be applied to the first conductive film 21 at the same time as the conductive paste 12 is applied.

The insulating material 11 is prepared in, for example, an ink state (i.e., liquid state) and has fluidity. The insulating material 11 is applied in a fluid state to the first conductive film 21 by, for example, a screen printing method or an ink-jet method. The "ink-jet" method generates fine droplets of the insulating material 11 and directly applies the droplets to the first conductive film 21.

As shown in FIG. 3(c), the insulating material 11 is applied to the first conductive film 21 such that the thickness thereof is less than the thickness t1 of the conductive paste 12. That is, the thickness t2 of the insulating material 11 is less than the thickness t1 of the conductive paste 12.

In the case where the thickness t2 of the insulating material 11 is less than the thickness t1 of the conductive paste 12 and the screen printing method is used, an apparatus that considers the difference in thickness between the insulating material 11 and the conductive paste 12 is needed. However, for example, when the ink-jet method is used, it is possible to apply the insulating material 11 such that the thickness t2 of the insulating material 11 is less than the thickness t1 of the conductive paste 12, using a general-purpose apparatus, without being distracted by the thickness t1 of the conductive paste 12. Therefore, the use of the ink-jet method makes it possible to reduce manufacturing costs.

As shown in FIG. 3(c), the insulating material 11 is applied to the first conductive film 21 at a position which is different from that where the conductive paste 12 is applied. That is, the insulating material 11 is applied only in a region in which the insulating material 11 does not overlay the conductive paste 12 while avoiding the conductive paste 12.

The insulating material 11 is applied to the first conductive film 21 such that a gap c (i.e., clearance) is to exit between the insulating material 11 and the conductive paste 12. For example, the gap c is ensured so as to be more than the position tolerance of the conductive paste 12 and the insulating material 11. That is, the gap c is adjusted such that the conductive paste 12 and the insulating material 11 do not overlay each other even when the deviation between the positions (i.e., application positions) where the conductive paste 12 and the insulating material 11 are provided is the maximum due to various kinds of errors.

For example, the applied insulating material 11 is heated and semi-cured (i.e., preliminarily cured). For example, after the insulating material 11 is applied, the insulating material 11 may lose its shape and be sheared. That is, after the insulating material 11 is applied, the insulating material 11 may lose its shape so as to fill the gap c and come into contact with the side surface of the conductive paste 12.

Then, as shown in FIG. 3(d), a second conductive film 22 is overlaid on the conductive paste 12 and the insulating material 11 (Step 4). That is, the second conductive film 22 is overlaid on the conductive paste 12 and the insulating material 11 from the side opposite to the first conductive film 21.

The second conductive film 22 is a plate-shaped (i.e., planar) metal film in which the second conductive pattern 5 will be formed in the subsequent process. That is, the second conductive film 22 is a flat film on which a wiring pattern is not provided. The second conductive film 22 is, for example, a copper film, but is not limited thereto.

As described above, the thickness t1 of the conductive paste 12 is more than the thickness t2 of the insulating material 11. Therefore, as shown in FIG. 3(d), when the second conductive film 22 is overlaid on the insulating material 11 and the conductive paste 12, the conductive paste 12 reliably comes into contact with the second conductive film 22 before the insulating material 11 comes into contact with the second conductive film 22. In this way, the reliability of the connection between the conductive paste 12 and the second conductive film 22 is improved.

The conductive paste 12 and the insulating material 11 are interposed between the first conductive film 21 and the second conductive film 22 in a so-called B stage in which they are semi-cured (i.e., preliminarily cured). Then, heat and pressure are applied to the first conductive film 21 and the second conductive film 22 so as to come into pressure contact with (so as to be laminated on) the conductive paste 12 and the insulating material 11.

In this process, the conductive paste 12 is pressed between the first conductive film 21 and the second conductive film 22 and is deformed so as to have a thickness substantially equal to the thickness of the insulating material 11. In this process, vacuum pressing is performed to remove the air between the second conductive film 22 and the insulating material 11. In this way, the occurrence of a void is prevented.

Then, as shown in FIG. 3(e), the conductive paste 12 is cured between the first conductive film 21 and the second conductive film 22 to bond the first conductive film 21 and the second conductive film 22 (e.g., metal bonding). In this way, the conductive paste 12 serves as the via 3. The insulating material 11 is cured between the first conductive film 21 and the second conductive film 22 and becomes the insulator 2. In this way, a double-sided plate is completed (Step 5). When the conductive paste 12 is pressed as described above, at least a portion of the boundary between the via 3 and the insulator 2 has, for example, a curved surface shape.

Then, as shown in FIG. 3(f), the first conductive pattern 4 is provided (i.e., formed) from the first conductive film 21 by pattern etching. In the same manner, the second conductive pattern 5 is provided (i.e., formed) from the second conductive film 22 by pattern etching. In addition, the first cover layer 6 and the second cover layer 7 are laminated. A surface treatment and an outline forming process are performed and the flexible printed wiring board 1 is completed (Step 6).

Figure 4:
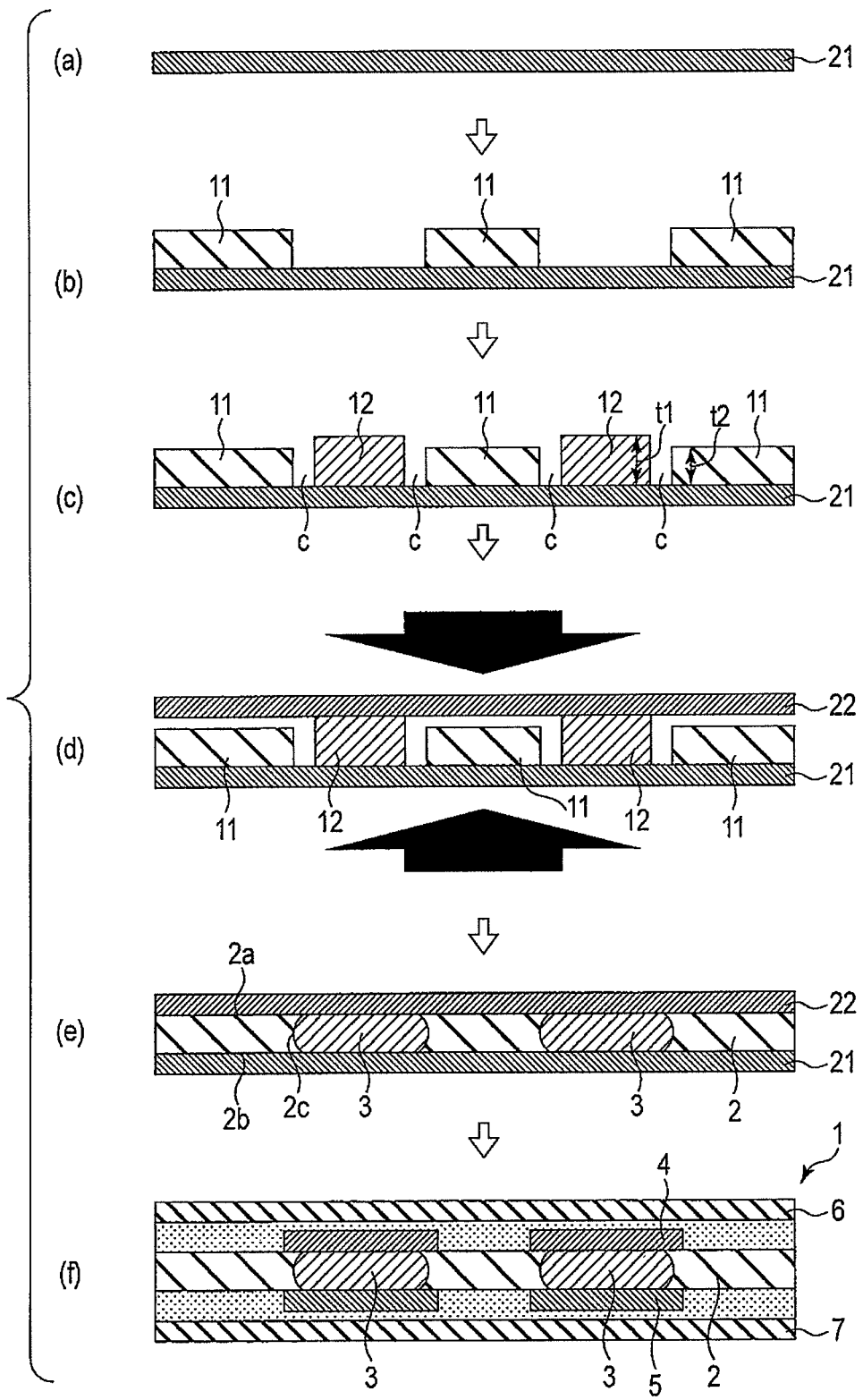
FIG. 4 is an exemplary diagram schematically illustrating a second method of manufacturing the printed wiring board shown in FIG. 2.

Next, a second manufacturing method, which is another example of the method of manufacturing the flexible printed wiring board 1, will be described with reference to FIG. 4. The processes and details of the second manufacturing method are similar to those of the first manufacturing method shown in FIG. 3 except that the processes shown in FIGS. 3(b) and 3(c) are reversed.

Specifically, first, as shown in FIG. 4(a), the first conductive film 21 is prepared. Then, as shown in FIG. 4(b), the insulating material 11 forming the insulator 2 is applied to the first conductive film 21 by, for example, a screen printing method or an ink-jet method. The insulating material 11 is applied to the first conductive film 21 at a position which is different from that where the conductive paste 12 is applied. That is, the insulating material 11 is applied only in a region that does not overlay the conductive paste 12. The insulating material 11 is applied to the first conductive film 21 such that the gap c is to exit between the insulating material 11 and the conductive paste 12.

Then, as shown in FIG. 4(c), the conductive paste 12 forming the via 3 is applied to the first conductive film 21 by, for example, a screen printing method or an ink-jet method. For example, after the insulating material 11 is applied, the conductive paste 12 is applied to the first conductive film 21. In the manufacturing method, the thickness t2 of the insulating material 11 is less than the thickness t1 of the conductive paste 12.

In the second manufacturing method, the conductive paste 12 is applied after the insulating material 11 is applied. Therefore, in the screen printing method, the embodiment is not limited to the apparatus considering the difference in thickness between the insulating material 11 and the conductive paste 12.

Then, similarly to the first manufacturing method, the processes shown in FIGS. 4(d), 4(e), and 4(f) (that is, Steps 4, 5, and 6) are performed and the flexible printed wiring board 1 is completed.

According to this structure, it is possible to reduce the thickness and weight of the flexible printed wiring board 1. The reason will be described below.

First, as a first comparative example, a printed wiring board is considered in which holes are provided in the substrate on which a copper film is laminated and through-holes are formed by plating. In this case, a plating layer is provided on the inner surface of the hole of the substrate and on the copper film on the surface of the substrate. That is, the plating layer is formed on the copper film on the surface of the substrate.

For example, the thickness of the copper film is 18 μm. The thickness of the plating layer is, for example, 15 μm. Therefore, a conductive portion with a total thickness of 33 μm is provided on the surface of the substrate. Therefore, the printed wiring board is likely to be thick. That is, it is difficult to reduce the thickness of the printed wiring board.

When a thick conductive portion is provided on the surface of the base, the flexible printed wiring board is less likely to be bent. This reduces the application range of the flexible printed wiring board. In some cases, the flexible printed wiring board is provided in the housing while being bent and deformed. Therefore, the flexible printed wiring board which is less likely to be bent has an adverse effect on the assemblability.

Each of the copper film and the plating layer is made of a metal and is relatively heavy. Therefore, when a thick conductive portion is provided on the surface of the substrate, the weight of the printed wiring board is likely to increase. That is, it is difficult to reduce the weight of the printed wiring board.

Next, as a second comparative example, an Any Layer Interstitial Via Hole (ALIVH) (trademark)-based manufacturing process is considered. In the ALIVH-based manufacturing process, holes are formed in prepreg made of a glass epoxy resin by laser machining, the holes are filled up with conductive paste, and a copper film is laminated. This process is repeatedly performed to laminate conductive layers, thereby forming a multi-layer board. In the ALIVH-based manufacturing process, expensive laser machining is needed and manufacturing costs are likely to increase.

Next, as a third comparative example, a Buried Bump Interconnection Technology (B2it) (trademark)-based manufacturing process is considered. In the B2it-based manufacturing process, conical conductive paste is formed on a copper film and the copper film is laminated on a sheet prepreg made of a glass epoxy resin such that the conical conductive paste passes through the prepreg. This process is repeatedly performed to laminate conductive layers, thereby forming a multi-layer board.

In the B2it-based manufacturing process, it takes much time and cost to produce the conical conductive paste. That is, it is difficult to form the conical conductive paste with one applying process (i.e., one printing process), but three to four printing processes are needed in order to form the conical conductive paste. That is, a lower layer is printed and then cured a little, an intermediate layer which is smaller than the lower layer is printed on the lower layer and then cured a little, and an upper layer which is smaller than the intermediate layer is printed on the intermediate layer and then cured.

In order to form the conductive paste in a conical shape, it is necessary to specially adjust the viscosity of the conductive paste. The conductive paste needs to have high hardness in order to pass through the glass epoxy resin prepreg. In general, as hardness increases, electric resistivity increases. Therefore, in the B2it-based manufacturing process, it is easy to increase the electric resistivity of the via and it is difficult to reduce electrical loss.

In the flexible printed wiring board 1 according to the embodiment includes the via 3, the insulator 2 applied around the via 3, the first conductive pattern 4 provided on the first surface 2a of the insulator 2 and connected to the via 3, and the second conductive pattern 5 provided on the second surface 2b of the insulator 2 and connected to the via 3. That is, since the insulator 2 is applied around the via 3, a process of forming a hole in the insulator 2 and forming a through-hole using plating is not needed.

From another point of view, the flexible printed wiring board 1 according to the embodiment is manufactured by applying the conductive paste 12 and the insulating material 11 to the first conductive film 21, interposing the conductive paste 12 and the insulating material 11 between the first conductive film 21 and the second conductive film 22 in a semi-cured state, forming the first conductive pattern 4 from the first conductive film 21, and forming the second conductive pattern 5 from the second conductive film 22.

In the flexible printed wiring board 1 having the above-mentioned structure, as shown in FIG. 2, since there is no plating layer on the conductive patterns 4 and 5, it is possible to reduce the thickness and weight of the flexible printed wiring board 1. In addition, since there is no plating layer, the flexible printed wiring board 1 is likely to be bent and has a wide application range and high assemblability.

Since a laser boring process is not needed as compared to the ALIVH-based manufacturing process, it is easy to reduce manufacturing costs. In addition, since the number of printing processes is less than that in the B2it-based manufacturing process, it is possible to reduce the number of processes. That is, it is possible to reduce the manufacturing costs of the printed wiring board 1.

According to the manufacturing method of the embodiment, the conductive paste 12 does not need to have high hardness, as compared to the B2it-based manufacturing process. Therefore, it is possible to use the conductive paste 12 with low electric resistance. In this way, even when a frequency within a high frequency band (e.g., a gigahertz band) is applied, it is possible to provide the flexible printed wiring board 1 without a great loss.

In the current technique of the ALIVH-based manufacturing process and the B2it-based manufacturing process, it is difficult to manufacture a flexible printed wiring board. However, according to the manufacturing method of the embodiment, it is possible to manufacture a flexible printed wiring board.

The structure of the embodiment has the following advantages.

For comparison, FIG. 12 shows a board 100 in which a substrate 101, a copper film 102, and a plating layer 103 are laminated. In a process of performing pattern etching on the board 100, an etching mask 104 is on the plating layer 103. In this way, a portion of a conductive layer which is covered with the etching mask 104 remains and a portion of the conductive layer which is not covered with the etching mask 104 is removed.

Figure 13:
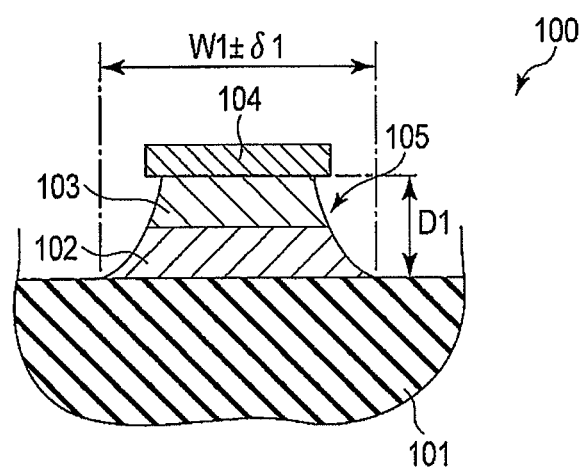
FIG. 13 is an exemplary cross-sectional view schematically illustrating the printed wiring board shown in FIG. 12 after etching.

FIG. 13 shows the board 100 after the etching process. When there are the copper film 102 and the plating layer 103 as shown in FIG. 13, an etching depth D1 is large. The line width W1 of a conductive pattern 105 formed by the etching process is likely to have a large skirt and be wide. In addition, the error 51 of the line width W1 of the conductive pattern 105 is likely to increase.

Figure 5:
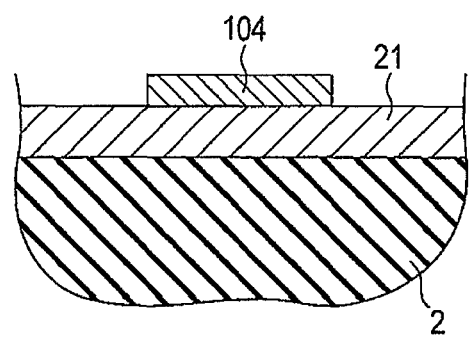
FIG. 5 is an exemplary cross-sectional view schematically illustrating the printed wiring board shown in FIG. 2 before etching.
Figure 6:
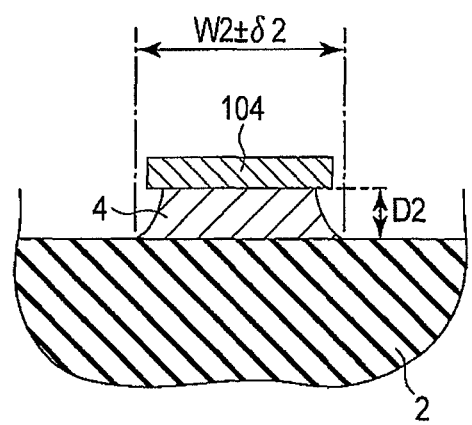
FIG. 6 is an exemplary cross-sectional view schematically illustrating the printed wiring board shown in FIG. 2 after etching.

According to the structure of the embodiment, as shown in FIG. 5, only the conductive film 21 is provided on the insulator 2, and no plating layer is provided on the insulator 2. Therefore, as shown in FIG. 6, an etching depth D2 is small. The line width W2 of the conductive pattern 4 formed by the etching process is likely to be reduced. In addition, since the line width W2 of the conductive pattern 4 is less than the line width W1, an error $\delta 2$ is likely to be less than the error $\delta 1$.

As a result, in the structure according to the embodiment, (1) it is possible to reduce the line widths W2 of the conductive patterns 4 and 5 and thus lay out a plurality of wirings at small pitches. This contributes to reducing the size and weight of the flexible printed wiring board 1 and mounting components with high density.

In addition, in the structure according to the embodiment, (2) it is possible to suppress the generation of noise. That is, when the input or output impedance of an electronic device is not matched with the impedance of a line of the printed wiring board, a signal is reflected and the reflected signal serves as noise and reduces signal quality, which may cause an operation error.

The structure according to the embodiment can reduce the error $\delta 2$ of the line width W2 of the conductive patterns 4 and 5 and thus adjust characteristic impedance (i.e., differential impedance) with high accuracy. Therefore, it is possible to suppress the generation of noise and improve the reliability of the flexible printed wiring board 1.

In the embodiment, the insulating material 11 is applied with a thickness t2 less than the thickness t1 of the conductive paste 12 to the first conductive film 21. Therefore, when the conductive paste 12 and the insulating material 11 are interposed between the first conductive film 21 and the second conductive film 22, the conductive paste 12 reliably contacts the first conductive film 21 and the second conductive film 22. Therefore, the contact of the conductive paste 12 with the first conductive film 21 and the second conductive film 22 is less likely to be reduced and the electric resistance value between the first conductive film 21 and the second conductive film 22 and the conductive paste 12 is likely to be small.

In the embodiment, when the conductive paste 12 is interposed between the first conductive film 21 and the second conductive film 22, the conductive paste 12 is deformed so as to have a thickness which is substantially equal to the thickness of the insulating material 11. That is, the conductive paste 12 is pressed between the first conductive film 21 and the second conductive film 22 and is deformed. In this process, residual stress due to pressure remains in the conductive paste 12.

Electronic components are mounted on the flexible printed wiring board 1 by, for example, soldering. In this case, the temperature of at least a portion of the flexible printed wiring board 1 increases to a soldering temperature (for example, about 260 degrees). In this case, thermal expansion occurs in the insulator 2. When there is residual stress in the conductive paste 12, the conductive paste 12 is likely to be expanded during the thermal expansion of the insulator 2. Therefore, it is easy to maintain the reliability of bonding.

In the embodiment, the insulating material 11 is applied such that the gap c is provided between the insulating material 11 and the conductive paste 12. According to this structure, the insulating material 11 is less likely to be inserted between the conductive paste 12 and the second conductive film 22 and it is possible to suppress an error in electrical connection. The gap c serves as a space for allowing the deformation of the conductive paste 12. Therefore, it is easy to set the thickness t1 of the conductive paste 12 to be more than the thickness t2 of the insulating material 11.

In the embodiment, the insulating material 11 is applied by the ink-jet method. According to this structure, a general-purpose apparatus can be used to apply the insulating material 11 with a small thickness, without being affected by the thickness t1 of the conductive paste 12. This contributes to reducing the manufacturing costs of the flexible printed wiring board 1.

Next, second to fourth embodiments will be described. In the second to fourth embodiments, components having the same or similar functions as those in the first embodiment are denoted by the same reference numerals and a description thereof will not be repeated. Structures other than the following structure are the same as those in the first embodiment.

(Second Embodiment)

Figure 7:
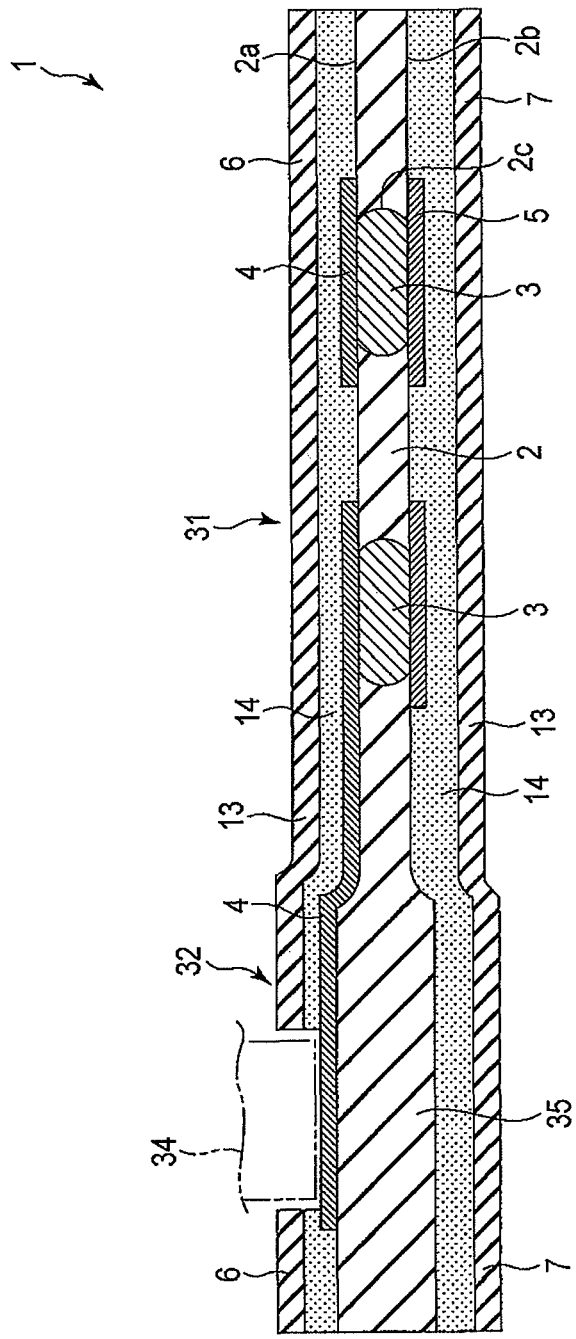
FIG. 7 is an exemplary cross-sectional view schematically illustrating a printed wiring board according to a second embodiment.

FIG. 7 shows a flexible printed wiring board 1 according to the second embodiment. The flexible printed wiring board 1 according to the embodiment has a non-uniform thickness. For example, the flexible printed wiring board 1 includes a first portion 31 and a second portion 32 which is thicker than the first portion 31.

The first portion 31 is a region in which no component (e.g., electronic component) is mounted and which has high flexibility (e.g., bendability). The first portion 31 has substantially the same structure as the flexible printed wiring board 1 according to the first embodiment. That is, the first portion 31 includes a first insulator 2, a via 3, a first conductive pattern 4, a second conductive pattern 5, a first cover layer 6, and a second cover layer 7.

The second portion 32 is a region in which a component 34 (e.g., electronic component) is mounted and which is less deformed (i.e., bent) than the first portion 31. The second portion 32 includes a second insulator 35, the first conductive pattern 4, the second conductive pattern 5 (not shown), the first cover layer 6, and the second cover layer 7. The second insulator 35 corresponds to the first insulator 2 and is disposed between the first conductive pattern 4 and the second conductive pattern 5. The second insulator 35 is thicker than the first insulator 2.

The second insulator 35 is formed by changing the thickness of the applied insulating material 11 with respect to the first insulator 2. For example, the use of an ink-jet method makes it possible to partially change the thickness of the applied insulating material. According to this structure, it is possible to improve the stability of the mounting of components and the reliability of the flexible printed wiring board 1.

In the example shown in FIG. 7, the second portion 32 does not include the via 3, and the embodiment is not limited thereto. The second portion 32 may include the via 3. In this case, the via 3 of the second portion 32 is formed by changing the thickness of the applied conductive paste 12 with respect to the via 3 of the first portion 31.

(Third Embodiment)

Figure 8:
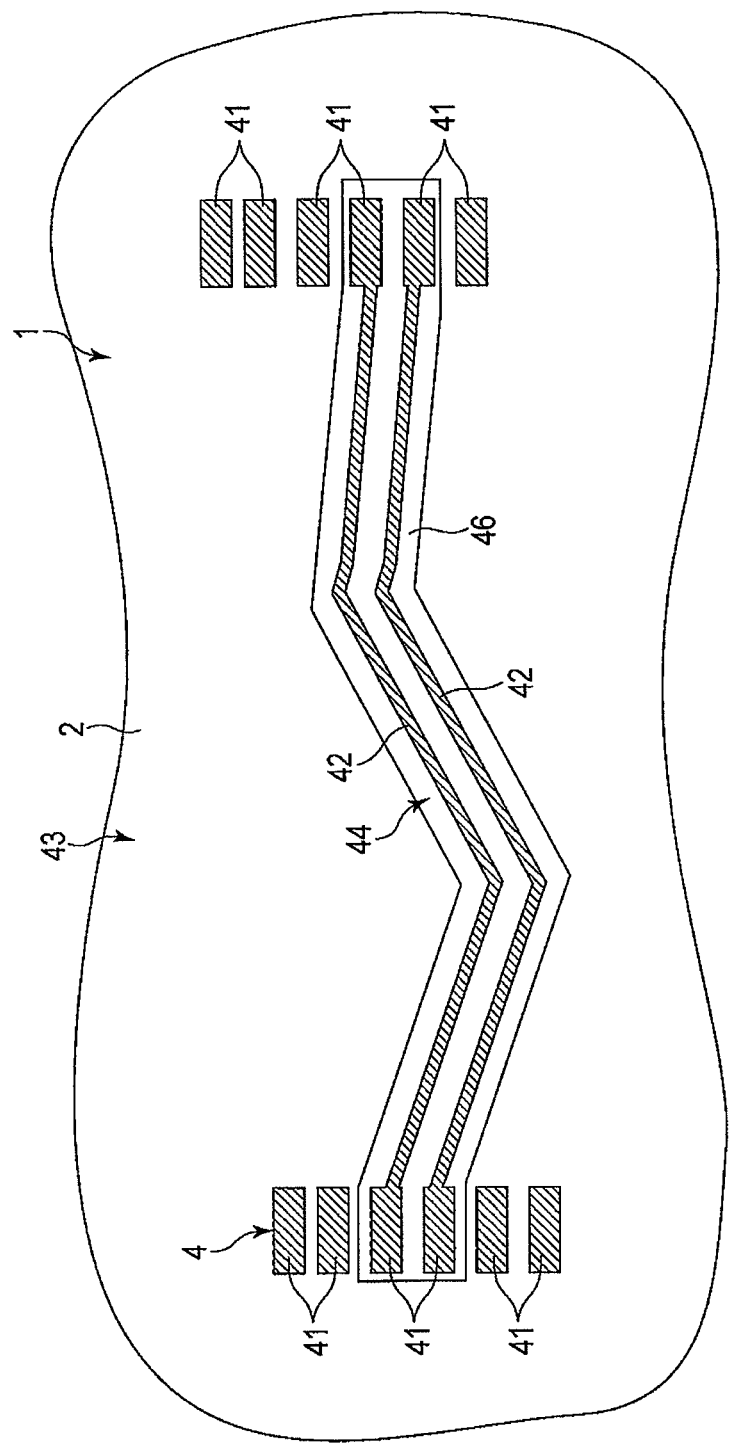
FIG. 8 is an exemplary cross-sectional view schematically illustrating a printed wiring board according to a third embodiment.

FIG. 8 shows a flexible printed wiring board 1 according to a third embodiment. In FIG. 8, for convenience of explanation, a first conductive pattern 4 is hatched. In the flexible printed wiring board 1 according to the embodiment, different kinds of insulating materials are partially used. As shown in FIG. 8, the first conductive pattern 4 (or a second conductive pattern 5) includes pads 41 and signal lines 42 connecting the pads 41. The signal line 42 is, for example, a wiring line (e.g., a differential line) used in high-speed transmission.

The flexible printed wiring board 1 according to the embodiment includes a first portion 43 and a second portion 44. The first portion 43 is a region in which, for example, the signal line 42 is not provided. The first portion 43 has substantially the same structure as the flexible printed wiring board 1 according to the first embodiment. That is, the first portion 43 includes a first insulator 2, a via 3, the first conductive pattern 4, the second conductive pattern 5, a first cover layer 6, and a second cover layer 7.

The second portion 44 is a region corresponding to the signal lines 42, that is, a region in which the signal lines 42 are provided. The second portion 44 is disposed below the signal lines 42, for example. The second portion 44 includes a second insulator 46, the first conductive pattern 4, the second conductive pattern 5, the first cover layer 6, and the second cover layer 7. The second insulator 46 is a portion corresponding to the first insulator 2 and is provided between the first conductive pattern 4 and the second conductive pattern 5. The second insulator 46 is made of a different kind of insulating material 11 from that forming the first insulator 2.

In the transmission of signals on the printed wiring board, as a frequency increases, transmission loss increases. As a result, the signal is attenuated, which results in degradation in transmission quality. The transmission loss is the sum of conductor loss occurring in a conductor through which a signal is transmitted, dielectric loss caused by contact with a dielectric, and radiation loss occurring in a bent portion or the end of the wiring. The dielectric loss is caused by, for example, a dielectric constant and a dielectric loss tangent. Therefore, when the printed wiring board is made of a material with a low dielectric constant and a low dielectric loss tangent, the transmission loss is reduced.

However, the material with a low dielectric constant and a low dielectric loss tangent is generally expensive. Therefore, when the entire printed wiring board is made of the material with a low dielectric constant and a low dielectric loss tangent, manufacturing costs increase.

In the embodiment, the kind of insulating material 11 applied to the second insulator 46 is different from that applied to the first insulator 2. For example, an ink-jet method can be used to apply different kinds of insulating materials 11.

Specifically, as the insulating material 11 forming the second insulator 46, a material with a dielectric constant and a dielectric loss tangent less than those of the insulating material 11 forming the first insulator 2 is used. For example, the insulating material 11 forming the second insulator 46 includes a large number of fillers. While, as the insulating material 11 forming the first insulator 2, a general material is used. In this way, it is possible to suppress transmission loss while reducing the manufacturing costs of the flexible printed wiring board 1.

The insulating material 11 including a large amount of fillers is harder than the insulating material 11 including a small amount of fillers. As in the second embodiment, in the flexible printed wiring board 1 including the first portion 31 with high flexibility and the second portion 32 serving as a component mounting region, the insulating materials 11 forming the first portion 31 and the second portion 32 may be changed. For example, a general material is used as the insulating material 11 forming the first portion 31. The insulating material 11 forming the second portion 32 includes a larger amount of fillers than the insulating material 11 forming the first portion 31. According to this structure, the stability of the mounting of components is improved and the reliability of the flexible printed wiring board 1 is improved.

(Fourth Embodiment)

Figure 9:
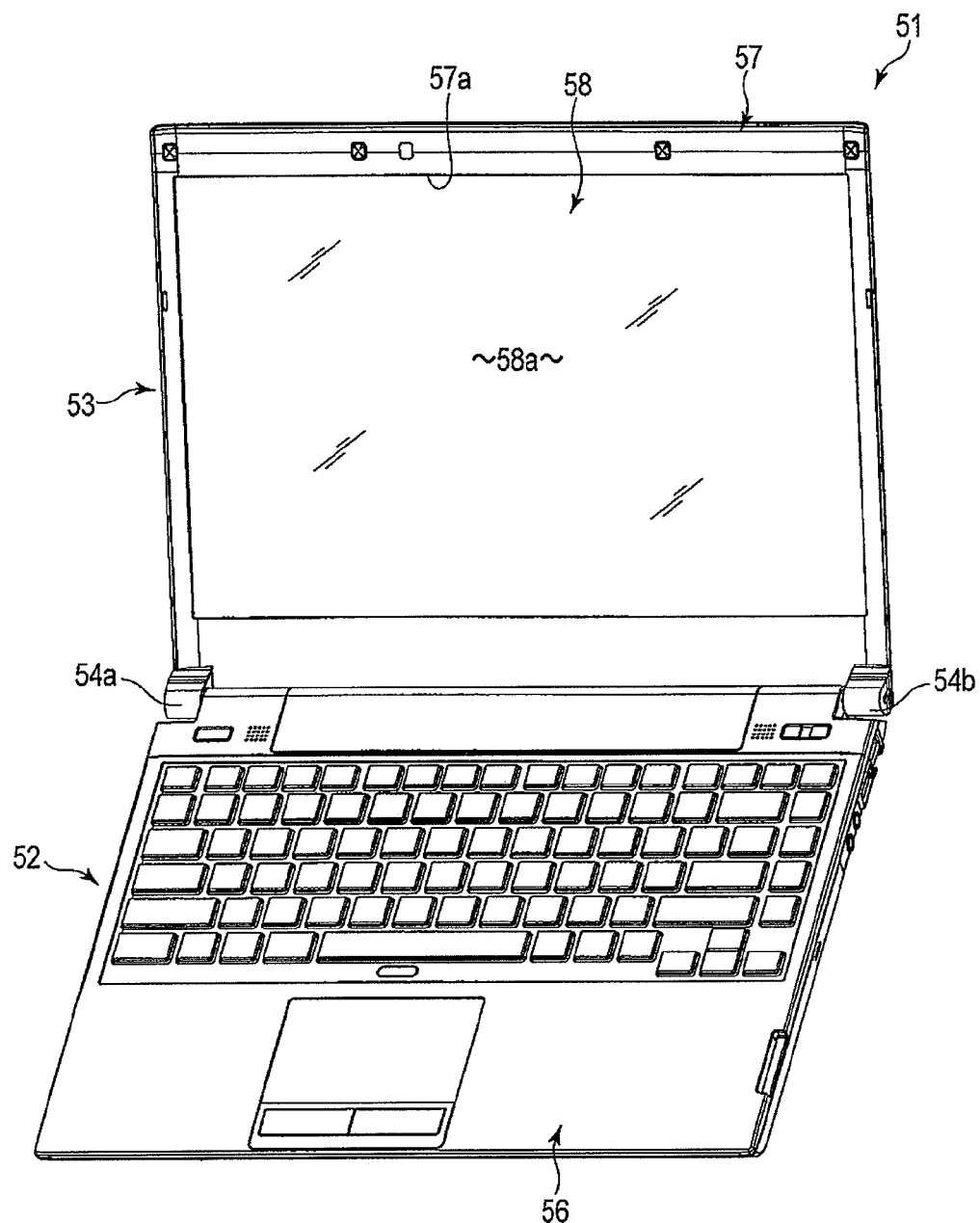
FIG. 9 is an exemplary perspective view of an electronic apparatus according to a fourth embodiment.

FIG. 9 shows an electronic apparatus 51 according to a fourth embodiment. The electronic apparatus 51 is, for example, a notebook portable computer (i.e., notebook PC). The electronic apparatus to which the embodiment can be applied is not limited thereto. The embodiment can be widely applied to various kinds of electronic apparatuses including a television, a tablet terminal, a slate portable computer (i.e., slate PC), a mobile phone, a smart phone, an electronic book terminal, and a game machine.

As shown in FIG. 9, the electronic apparatus 51 includes a first unit 52, a second unit 53, and hinge portions 54a and 54b. The first unit 52 is, for example, an electronic apparatus main unit. The first unit 52 includes a first housing 56.

The second unit 53 is, for example, a display unit and includes a second housing 57 and a display device 58 provided in the second housing 57. The display device 58 is, for example, a liquid crystal display, but is not limited thereto. The display device 58 includes a display screen 58a on which an image is displayed. The second housing 57 includes an opening portion 57a through which the display screen 58a is exposed to the outside.

The second housing 57 is rotatably (i.e., openably) connected to the rear end portion of the first housing 56 by the hinge portions 54a and 54b. In this way, the electronic apparatus is rotatable between a first position where the first unit 52 and the second unit 53 overlay each other and a second position where the first unit 52 and the second unit 53 are opened.

Next, the internal structure of the first housing 56 (hereinafter, simply referred to as a housing 56) will be described.

Figure 10:
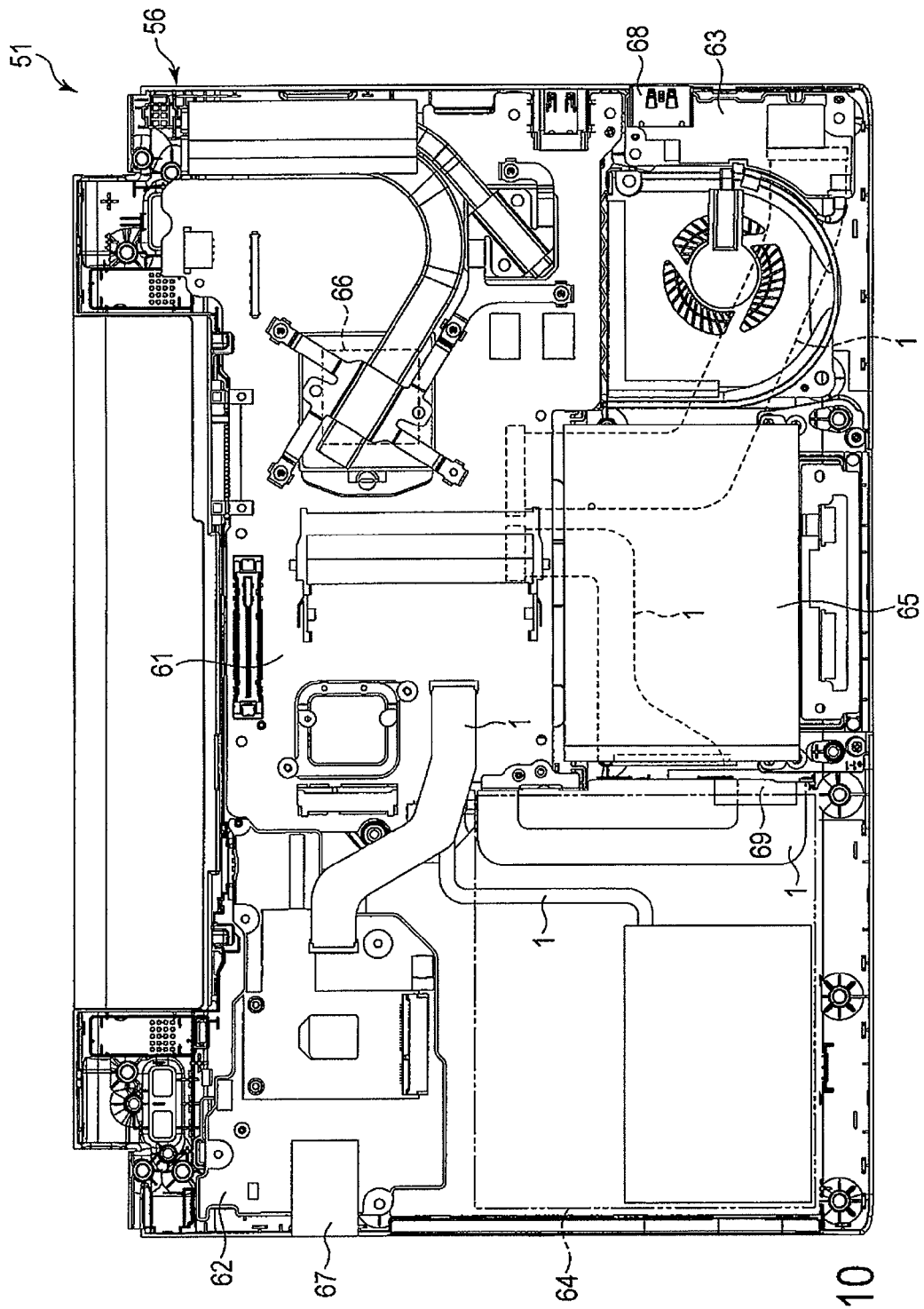
FIG. 10 is an exemplary bottom view of the internal structure of the electronic apparatus shown in FIG. 9.

As shown in FIG. 10, the housing 56 includes a first circuit board 61, a second circuit board 62, a third circuit board 63, an optical disk drive (ODD) unit 64, and a hard disk drive (HDD) unit 65.

The first circuit board 61 is, for example, a main board and has a CPU 66 mounted thereon. The second circuit board 62 is provided at a first end portion of the housing 56 and has a first connector 67 mounted thereon. The third circuit board 63 is provided at a second end portion of the housing 56 different from the first end portion where the second circuit board 62 is provided and has a second connector 68 mounted thereon. Signals in, for example, a high frequency band (e.g., a gigahertz band) flow to the first connector 67 and the second connector 68.

The electronic apparatus 51 further includes flexible printed wiring boards 1 that electrically connect the first circuit board 61 and each of the second circuit board 62, the third circuit board 63, the ODD unit 64, and the HDD unit 65. The flexible printed wiring boards 1 are the flexible printed wiring boards according to any one of the first to third embodiments.

FIG. 11 shows the flexible printed wiring board 1 that connects the ODD unit 64 and the first circuit board 61. A connector 69 connected to the ODD unit 64 is mounted on the flexible printed wiring board 1. The connector 69 is an example of an "electronic component". The flexible printed wiring board 1 on which electronic components are mounted is an example of a "module".

As shown in FIG. 11, the flexible printed wiring board 1 includes, for example, a first portion 71 that is provided along an inner surface 56a of the housing 56 and a second portion 72 that is bent with respect to the first portion 71 and is away from the inner surface 56a of the housing 56.

According to this structure, since the flexible printed wiring board 1 with a small thickness and a light weight is used, it is possible to reduce the thickness and weight of the electronic apparatus 51. In addition, in recent years, in order to reduce the thickness of the electronic apparatus 51, there is a tendency to reduce the size of the main board (e.g., first circuit board 61). Therefore, the distance between the first circuit board 61 and the connectors 67 and 68 provided on the side surface of the housing 56 increases and electrical loss is likely to occur therebetween.

In contrast, according to the structure of the embodiment, similarly to the first embodiment, since the conductive paste 12 with low electric resistivity can be used, it is possible to suppress loss between the first circuit board 61 and the connectors 67 and 68. This contributes to improving the performance of the electronic apparatus 51.

The embodiments are not limited to the above-described embodiments, and the components of the above-described embodiments may be changed without departing from the scope and spirit of the invention. In addition, a plurality of components according to the above-described embodiments may be appropriately combined with each other to form various embodiments. For example, some of the components according to the above-described embodiments may be removed. Components according to different embodiments may be appropriately combined with each other.

For example, as in the second embodiment, the thickness of the flexible printed wiring board 1 may be partially changed according to desired electrical characteristics. The insulating material 11 may not be applied with a thickness less than that of the conductive paste 12. The insulating material 11 may not be applied with the gap c from the conductive paste 12. The boundary between the via 3 and the insulator 2 may not have a curved surface. A method of applying the insulating material 11 and the conductive paste 12 is not limited to the screen printing method and the ink-jet method, and other applying methods may be used.

The first to fourth embodiments and modifications thereof are not limited to the flexible printed wiring board, and can be widely applied to various kinds of printed wiring boards including a rigid board and a rigid flexible board.

Some printed wiring boards, electronic apparatuses, and modules are additionally described below. The term "printed wiring board" herein is not limited to the flexible printed wiring board, and includes a rigid board or a rigid flexible board.

[1] A printed wiring board comprising: an insulator comprising a first surface, a second surface opposite to the first surface, and a hole between the first surface and the second surface; a via in the hole; a first conductive pattern connected to the via on the first surface of the insulator; and a second conductive pattern connected to the via on the second surface of the insulator. The via is made of conductive paste applied to a first conductive film by a screen printing method or an ink-jet method. The insulator is made of an insulating material applied by the screen printing method or the ink-jet method to the first conductive film at a position different from a position where the paste is to be applied, before the paste is applied, after the paste is applied, or at the same time as the paste is applied. A second conductive film is overlaid (i.e., laminated) on the paste and the insulating material from a side opposite to the first conductive film such that the paste and the insulating material are interposed between the first conductive film and the second conductive film in a semi-cured state. The first conductive pattern is provided from the first conductive film and the second conductive pattern is provided from the second conductive film.

[2] A printed wiring board comprising: an insulator comprising a first surface, a second surface opposite to the first surface, and a hole between the first surface and the second surface; a via in the hole; a first conductive pattern connected to the via on the first surface of the insulator; and a second conductive pattern connected to the via on the second surface of the insulator. The via is made of conductive paste applied to a first conductive film. The insulator is made of an insulating material applied to the first conductive film at a position different from a position where the paste is to be applied, before the paste is applied, after the paste is applied, or at the same time as the paste is applied. A second conductive film is overlaid (i.e., laminated) on the paste and the insulating material from a side opposite to the first conductive film. The first conductive pattern is provided from the first conductive film and the second conductive pattern is provided from the second conductive film.

[3] A printed wiring board comprising: a via; an insulator applied around the via; a first conductive pattern connected to the via on a first surface of the insulator; and a second conductive pattern connected to the via on a second surface of the insulator.

[4] An electronic apparatus comprising: a housing; and the printed wiring board according to any one of the above [1] to [3] which is in the housing.

[5] A module comprising: the printed wiring board according to any one of the above [1] to [3]; and a component (e.g., electronic component) on the printed wiring board.

There is a demand for reducing the thickness of the printed wiring board. According to the above-mentioned structure, it is possible to provide a printed wiring board with a small thickness.

Next, some methods of manufacturing a printed wiring board will be additionally described. The term "printed wiring board" herein includes a flexible board, a rigid board, or a rigid flexible board.

[i] A method of manufacturing a printed wiring board comprising: applying conductive paste to a first conductive film using a screen printing method or an ink-jet method; applying an insulating material to the first conductive film at a position different from a position where the paste is to be applied, using the screen printing method or the ink-jet method, before the paste is applied, after the paste is applied, or at the same time as the paste is applied; overlaying (i.e., laminating) a second conductive film on the paste and the insulating material from a side opposite to the first conductive film such that the paste and the insulating material are interposed between the first conductive film and the second conductive film in a semi-cured state; forming a first conductive pattern and a second conductive pattern from the first conductive film and the second conductive film, respectively.

[ii] A method of manufacturing a printed wiring board comprising: applying conductive paste to a first conductive film; applying an insulating material to the first conductive film before the paste is applied, after the paste is applied, or at the same time as the paste is applied; interposing the paste and the insulating material between the first conductive film and a second conductive film in a semi-cured state; forming a first conductive pattern and a second conductive pattern from the first conductive film and the second conductive film, respectively.

[iii] The method of manufacturing a printed wiring board according to the above [i] or [ii], wherein the printed wiring board is a flexible printed wiring board.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing; and
a flexible printed wiring board in the housing,
wherein the flexible printed wiring board comprises:
   a via made of a conductive paste applied on a first conductive film at a first position;
   an insulator made of an insulating material applied individually with respect to the paste on the first conductive film at a second position, the second position different from the first position, the insulator comprising a first surface and a second surface opposite to the first surface;
   a first conductive pattern provided from the first conductive film and connected to the via on the first surface; and
   a second conductive pattern provided from a second conductive film which is overlaid on the paste and the insulating material from a side opposite to the first conductive film, the second conductive pattern connected to the via on the second surface.

2. The electronic apparatus of claim 1,
wherein the insulator comprises a hole between the first surface and the second surface, and
wherein the via is in the hole.

3. The electronic apparatus of claim 1,
wherein the insulator is flexible.

4. The electronic apparatus of claim 1, further comprising:
a first cover layer on the first conductive pattern; and
a second cover layer on the second conductive pattern.

5. The electronic apparatus of claim 1,
wherein the paste is configured to be applied on the first conductive film by a screen printing method or an ink-jet method, and
wherein the insulating material is configured to be applied on the first conductive film by the screen printing method or the ink-jet method.

6. The electronic apparatus of claim 1,
wherein the insulating material is configured to be applied with a thickness less than a thickness of the paste.

7. The electronic apparatus of claim 6,
wherein the paste and the insulating material are configured to be interposed between the first conductive film and the second conductive film in a semi-cured state.

8. The electronic apparatus of claim 7,
wherein the paste is configured to be deformed so as to have a thickness substantially equal to that of the insulating material when the paste is pressed between the first conductive film and the second conductive film.

9. The electronic apparatus of claim 1,
wherein the insulating material is configured to be applied on the first conductive film such that a gap substantially perpendicular to a laminating direction of the flexible printed wiring board exists between the insulating material and the paste.

10. The electronic apparatus of claim 1,
wherein the insulating material is configured to be applied by the ink-jet method.

11. The electronic apparatus of claim 1,
wherein the paste is configured to be applied by the ink-jet method.

12. The electronic apparatus of claim 1,
wherein at least a portion of a boundary between the via and the insulator comprises a curved surface.

13. The electronic apparatus of claim 1,
wherein the insulating material is configured to be applied on the first conductive film while avoiding the first position.

14. The electronic apparatus of claim 1,
wherein the insulating material is configured to be applied on the first conductive film after the paste is applied.

15. The electronic apparatus of claim 1,
wherein, the insulating material is configured to be applied on the first conductive film before the paste is applied.

16. The electronic apparatus of claim 1,
wherein the insulating material is configured to be applied on the first conductive film at the same time as the paste is applied.

* * * * *